United States Patent
Yamaki et al.

(10) Patent No.: US 9,424,929 B1
(45) Date of Patent: Aug. 23, 2016

(54) MEMORY SYSTEM AND MEMORY CONTROL METHOD

(71) Applicant: Kabushiki Kaisha Toshiba, Minato-ku (JP)

(72) Inventors: Ryo Yamaki, Yokohama (JP); Masanobu Shirakawa, Chigasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/848,829

(22) Filed: Sep. 9, 2015

Related U.S. Application Data

(60) Provisional application No. 62/131,506, filed on Mar. 11, 2015.

(51) Int. Cl.
| | |
|---|---|
| G11C 16/04 | (2006.01) |
| G11C 16/08 | (2006.01) |
| G11C 16/10 | (2006.01) |
| G11C 16/26 | (2006.01) |

(52) U.S. Cl.
CPC .............. *G11C 16/08* (2013.01); *G11C 16/10* (2013.01); *G11C 16/26* (2013.01)

(58) Field of Classification Search
USPC .......... 365/185.17, 185.09, 185.12; 711/764, 711/101, 103
See application file for complete search history.

(56) References Cited

U.S. PATENT DOCUMENTS

| | | | |
|---|---|---|---|
| 8,694,873 B2 | 4/2014 | Kim et al. | |
| 2010/0162083 A1* | 6/2010 | Chung | G06F 11/1068 714/764 |
| 2011/0283165 A1 | 11/2011 | Nishiyama | |
| 2012/0198135 A1* | 8/2012 | Chilappagari | G11C 11/5621 711/103 |

FOREIGN PATENT DOCUMENTS

| | | |
|---|---|---|
| JP | 2011-242884 | 12/2011 |
| JP | 2011-243116 | 12/2011 |

* cited by examiner

*Primary Examiner* — Vu Le
(74) *Attorney, Agent, or Firm* — Oblon, McClelland, Maier & Neustadt, L.L.P.

(57) ABSTRACT

According to an embodiment, a memory system includes: a nonvolatile memory to which data in the unit of I/O data of the first number of bits are capable of being input in parallel, and from which data in the unit of I/O data are capable of being output in parallel; a memory interface; an encoding unit configured to generate the second number of codewords; a decoding unit configured to decode a received word read from the nonvolatile memory; and a control unit configured to link an I/O number to the number of the codeword, inputs, to the encoder, each of the codewords of the data to be input to the nonvolatile memory as the data about the position of the bit having the I/O number corresponding to the codeword, reads the second number of received words from the nonvolatile memory to decode the received words, and, when there is a received word that fails to be decoded, reads the received words again after changing the reading voltage, and decodes the received word.

20 Claims, 13 Drawing Sheets

MEMORY SYSTEM AND MEMORY CONTROL METHOD

CROSS-REFERENCE TO RELATED APPLICATIONS

This application is based upon and claims the benefit of priority from U.S. Provisional Application No. 62/131,506, filed on Mar. 11, 2015; the entire contents of which are incorporated herein by reference.

FIELD

Embodiments described herein relate generally to a memory system, and a memory control method.

BACKGROUND

A storage device with a NAND flash memory (hereinafter, referred to as a NAND memory) stores data in accordance with the number of electrons (the amount of charge) at the floating gate in the memory cell. The data may be read by the application of voltage (reading voltage) in accordance with the amount of charge. However, the amount of charge of the memory cell sometimes varies due to various factors. A variation in the amount of charge sometimes prevents the data from correctly being read when a predetermined reading voltage is applied. In light of the foregoing, a common storage device stores data after encoding the data with an error correcting code.

DETAILED DESCRIPTION

According to an embodiment, a memory system includes a nonvolatile memory, a memory interface, an encoding unit, and a decoding unit. The nonvolatile memory is a memory to which data are capable of being input in the unit of I/O data and in parallel, and from which data are capable of being output in the unit and in parallel. The unit of I/O data is data of the first number of bits. The encoder encodes input data to generate the second number of codewords that is one M-th of the first number or that is M times the first number on the assumption that the M is an integer equal to or larger than one. The decoder decodes a received word corresponding to the codeword read from the nonvolatile memory. The memory system further includes a control unit. The control unit links I/O numbers to the second number of codewords. The control unit inputs, to the encoder, the data that is to be input to the nonvolatile memory as the data about the position of the bit having the I/O number corresponding to a codeword. The data is input to the encoder as the input data by the codeword. The control unit causes the memory interface to input, to the nonvolatile memory, a codeword as the data about the position of the bit having the I/O number corresponding to the codeword, and to write the input data to the nonvolatile memory. The control unit causes the memory interface to read the second number of received words corresponding to the second number of codewords from the nonvolatile memory. When the second number of read received words includes a received word that the decoding unit fails to decode, the control unit causes the memory interface to read the received words corresponding to the second number of codewords after changing the reading voltage to be applied to the nonvolatile memory, and the control unit causes the decoding unit to decode the received word corresponding the received word that fails to be decoded among the received words read with the changed reading voltage.

The memory system, and memory control method according to the embodiments will be described in detail hereinafter with reference to the appended drawings. Note that the present invention is not limited to the embodiments.

First Embodiment

Figure 1:
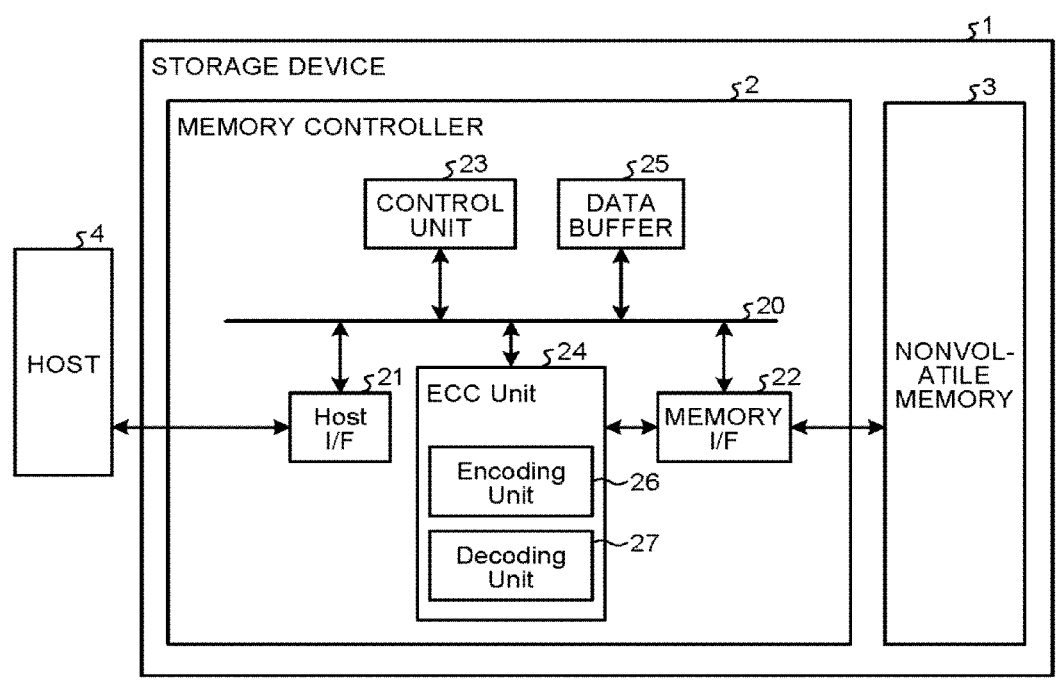
FIG. 1 is a block diagram of an exemplary configuration of a storage device according to a first embodiment.

FIG. 1 is a block diagram of an exemplary configuration of the storage device according to a first embodiment. A storage device 1 according to the present embodiment includes a memory controller 2, and a nonvolatile memory 3. The storage device 1 may be connected to a host 4. FIG. 1 illustrates the storage device 1 connected to the host 4. The host 4 is an electronic device, for example, a personal computer, or a mobile terminal.

The nonvolatile memory 3, which stores data without volatilization, is, for example, a NAND memory. Herein, an example in which a NAND memory is used as the nonvolatile memory 3 will be described. Note that, however, a storage unit such as a flash memory with a three-dimensional structure, a Resistance Random Access Memory (ReRAM), or a Ferroelectric Random Access Memory (FeRAM) may be used as the nonvolatile memory 3 instead of the NAND memory. Furthermore, an example in which a semiconductor memory is used as the storage unit will be described herein. However, the error correcting process according to the present embodiment may be applied to a storage device using a storage unit other than the semiconductor memory.

The storage device 1 may be, for example, a memory card including the memory controller 2 and the nonvolatile memory 3 in a package, or a Solid State Drive (SSD).

The memory controller 2 controls the writing to the nonvolatile memory 3 in accordance with a write command (request) from the host 4. Similarly, the memory controller 2 controls the reading from the nonvolatile memory 3 in accordance with a read command from the host 4. The memory controller 2 includes a host interface (Host I/F) 21, a memory interface (memory I/F) 22, a control unit 23, an ECC unit 24, and a data buffer 25. The Host I/F 21, the memory I/F 22, the control unit 23, the ECC unit 24, and the data buffer 25 are connected to each other via an internal bus 20.

The Host I/F 21 performs a process in accordance with the interface specification between the Host I/F 21 and the host 4 to output, for example, instructions or user data received from the host 4 to the internal bus 20. The Host I/F 21 transmits, for example, the user data read from the nonvolatile memory 3, or the response from the control unit 23 to the host 4. Note that the data to be written to the nonvolatile memory 3 in accordance with the write request from the host 4 is referred to as the user data in the present embodiment.

The memory I/F 22 writes data to the nonvolatile memory 3 in a writing process in accordance with the instruction from the control unit 23. Similarly, the memory I/F 22 reads data from the nonvolatile memory 3 in a reading process in accordance with the instruction from the control unit 23.

The control unit 23 is configured to generally control each of the components in the storage device 1. When receiving an instruction from the host 4 via the Host I/F 21, the control unit 23 controls the components in accordance with the instruction. For example, the control unit 23 gives the memory I/F 22 an instruction for writing the user data and its parity to the nonvolatile memory 3 in accordance with the instruction from the host 4. Similarly, the control unit 23 gives the memory I/F 22 an instruction for reading the user data and its parity from the nonvolatile memory 3 in accordance with the instruction from the host 4.

Furthermore, when receiving a write request from the host 4, the control unit 23 determines a storage region (memory region) in which the user data accumulated in the data buffer 25 is stored in the nonvolatile memory 3. In other words, the control unit 23 manages the place to which the user data is written. The link between the logical address of the user data received from the host 4 and the physical address indicating the storage region in which the user data is stored in the nonvolatile memory 3 is stored as an address translation table.

When receiving a read request from the host 4, the control unit 23 converts the logical address designated in the read request into the physical address with the address mapping table, and then gives the memory I/F 22 an instruction for reading the data from the physical address.

In a common NAND memory, data is written or read in a unit of data called a page, and is deleted in a unit of data called a block. A plurality of memory cells connected to a word line is referred to as a memory cell group in the present embodiment. When each of the memory cells is a single level cell (SLC), a memory cell group corresponds to a page. When each of the memory cells is a multi level cell (MLC), a memory cell group corresponds to a plurality of pages. The memory cells are connected also to a bit line while being connected to the word line. Each of the memory cells may be identified with the address for identifying the word line and the address for identifying the bit line.

The data buffer 25 temporarily stores the user data that the memory controller 2 receives from the host 4 until the user data is stored in the nonvolatile memory 3. The data buffer 25 temporarily stores the user data read from the nonvolatile memory 3 until the user data is transmitted to the host 4. The data buffer 25 temporarily stores codewords generated with the encoded user data. The data buffer 25 includes, for example, a general-purpose memory such as a Static Random Access Memory (SRAM) or a Dynamic Random Access Memory (DRAM).

The user data transmitted from the host 4 is transferred to the internal bus 20 and stored in the data buffer 25. The ECC unit 24 encodes the data to be stored in the nonvolatile memory 3 to generate a codeword. Any encoding method may be used for the encoding. For example, Reed Solomon (RS) encoding, Bose Chaudhuri Hocquenghem (BCH) encoding, or Low Density Parity Check (LDPC) encoding may be used. The ECC unit 24 includes an Encoding unit 26 and a Decoding unit 27. Encoding unit 26 includes at least one encoder. Decoding unit 27 includes at least one decoder. The details of the encoding and decoding according to the present embodiment will be described below.

Figure 2:
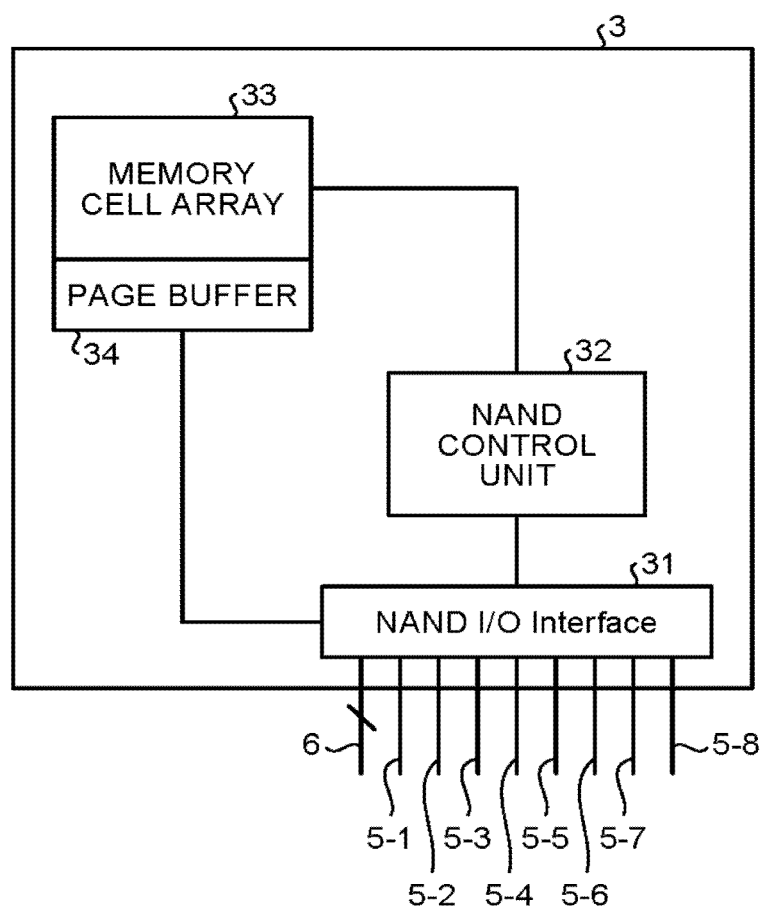
FIG. 2 is a diagram of an exemplary configuration of a nonvolatile memory according to embodiments.

As described above, the nonvolatile memory 3 in the present embodiment is a NAND memory. FIG. 2 is a diagram of an exemplary configuration of the nonvolatile memory 3 according to the present embodiment. As illustrated in FIG. 2, the nonvolatile memory 3 includes a NAND I/O Interface 31, a NAND control unit 32, a memory cell array (NAND memory cell array) 33, and a page buffer 34.

The NAND I/O Interface 31 includes a port for a control signal, a port for data, pins 6 for inputting and outputting a control signal, and pins 5-1 to 5-8 for inputting and outputting data. The NAND I/O Interface 31 controls the input from and output to an external device, and inputs a command such as a write request or a read request to the NAND control unit 32 when the command is input from an external device via the pins 6. The NAND control unit 32 controls the operation of the nonvolatile memory 3 in accordance with, for example, the command input from the NAND I/O Interface 31.

Specifically, when a write request is input, the NAND control unit 32 temporarily stores the data to be written and input via the pins 5-1 to 5-8 in the page buffer 34 and controls the components to write the data from the page buffer 34 to the memory cell array 33. Alternatively, when a read request is input, the NAND control unit 32 controls the components to read the data of the read request from the memory cell array 33. The data read from the memory cell array 33 is stored in the page buffer 34 and is output via the pins 5-1 to 5-8 to the memory controller 2. Note that the number of bits (the first number of bits) that is the unit of data to be input to and output from the nonvolatile memory 3 via the pins 5-1 to 5-8 in parallel, namely, eight bits is referred to as the unit of input and output (I/O) data in the present embodiment. Each of the numbers that are put to the pins 5-1 to 5-8, respectively, is referred to as an I/O number. The I/O numbers corresponding to the pins 5-1, 5-2, . . . , and 5-8 are zero, one, . . . , and seven, respectively. In other words, I/O numbers may be referred to as bit numbers in a unit of I/O data. Note that the unit of I/O data is not limited to eight bits, and may be, for example, 16 bits although an example in which the unit of I/O data is eight bits is described herein.

The memory cell array 33 includes word lines and bit lines as described below such that data is read and written by the word line. The data input from the pins 5-1 to 5-8 is stored via the page buffer 34 in the memory cell array 33. However, each of the pins 5-1 to 5-8 corresponds to a plurality of bit lines. For example, the data input from the pin 5-1 is stored in memory cells connected to bit lines BL0, BL8, . . . . The data input from the pin 5-2 is stored in memory cells connected to bit lines BL1, BL9, . . . . The data input from the pin 5-3 is stored in memory cells connected to bit lines BL2, BL10, . . . . The pins 5-1 to 5-8 correspond to the bit lines as described above. Note that, although the link between the pin and the bit lines is described on the assumption of the example to simplify the description, the link is not limited to the example.

Figure 3:
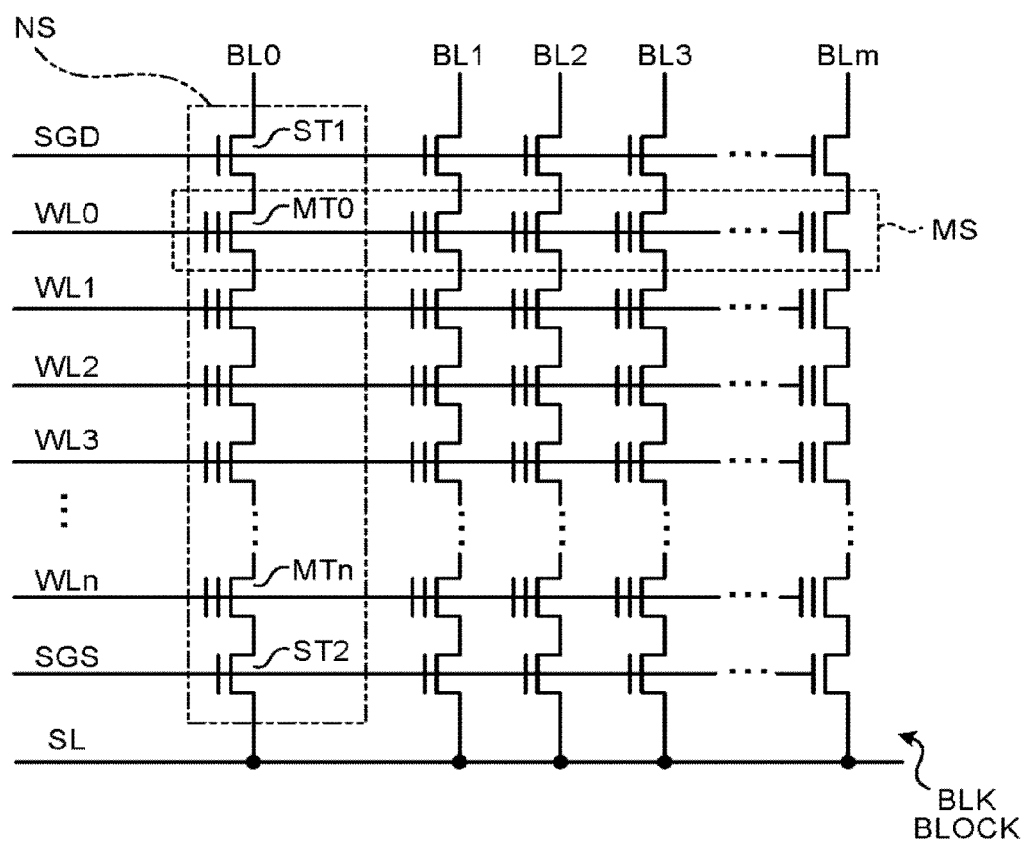
FIG. 3 is a diagram of an exemplary configuration of the block of a memory cell array with a two-dimensional structure.
Figure 4:
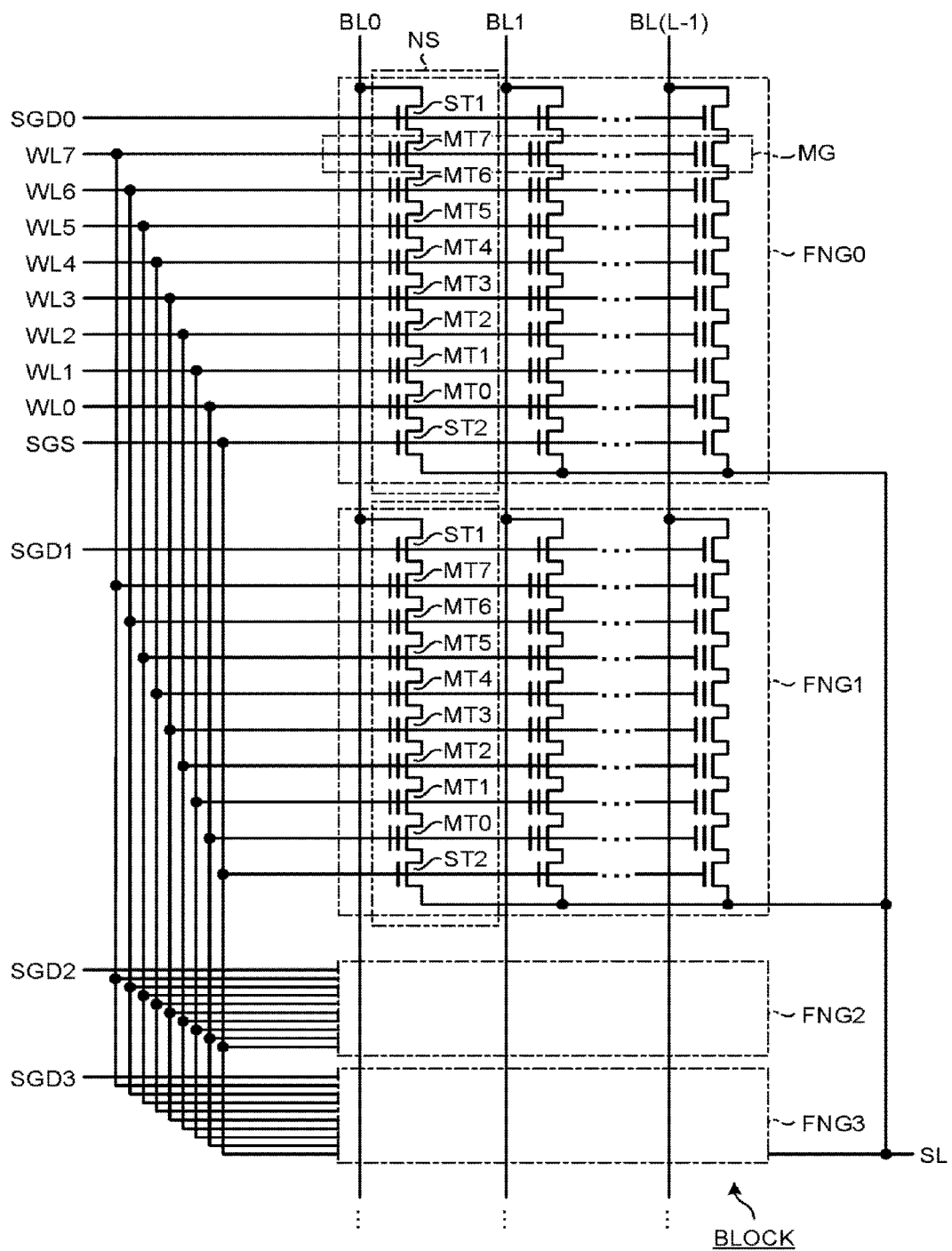
FIG. 4 is a diagram of an exemplary configuration of the block of a memory cell array with a three-dimensional structure.

Any configuration of the memory cell array is used without a special limitation for the memory cell array 33 on the assumption of the present embodiment. The memory cell array may have a two-dimensional structure as illustrated in FIG. 3, or may have a three-dimensional structure as illustrated in FIG. 4. Alternatively, the memory cell array may have a structure except for the structures.

FIG. 3 is a diagram of an exemplary configuration of a block of a memory cell array with a two-dimensional structure. FIG. 3 illustrates one of the blocks forming a memory cell array with a two-dimensional structure. The other blocks of the memory cell array have the same structure as the structure in FIG. 3. As illustrated in FIG. 3, a block BLK of the memory cell array includes (m+1) (the m is an integer equal to or larger than zero) NAND strings NS. Each of the NAND strings NS includes (n+1) (the n is an integer equal to or larger than zero) memory cell transistors MT0 to MTn, and select transistors ST1 and ST2 that are placed on both sides of a sequence of the (n+1) memory cell transistors MT0 to MTn. Each of the memory cell transistors MT shares a diffusion region (a source region or a drain region) with its facing memory cell transistor MT. The memory cell transistors MT are connected to each other in series.

The control gate electrodes of the memory cell transistors MT0 to MTn forming the NAND string NS are connected to the word lines WL0 to WLn, respectively. The memory cell transistors MTi (i=0 to n) in the NAND strings NS are commonly connected to a word line WLi (i=0 to n). In other words, the control gate electrodes of the memory cell transistors MTi on the same row are connected to a word line WLi in the block BLK.

Each of the memory cell transistors MT0 to MTn is a field-effect transistor having a stacked gate structure formed on a semiconductor substrate. In that case, the stacked gate structure includes a charge accumulating layer (floating gate electrode) and a control gate electrode. The charge accumulating layer is formed on the semiconductor substrate while a gate insulation film is placed therebetween. The control gate electrode is formed on the charge accumulating layer while an inter-gate insulation film is placed therebetween. The threshold voltage of each of the memory cell transistors MT0 to MTn varies depending on the number of electrons accumulated in the floating gate electrode. Data may be stored in accordance with the variations of the threshold voltage.

The bit lines BL0 to BLm are connected to the drains of the (m+1) select transistors ST1, and a select gate line SGD is commonly connected to the gates of the (m+1) select transistors ST1 in a block BLK. The source of the select transistor ST1 is connected to the drain of the memory cell transistor MT0. Similarly, a source line SL is commonly connected to the sources of (m+1) select transistors ST2 and a select gate line SGS is commonly connected to the gates of the (m+1) select transistors ST2 in a block BLK. The drain of a select transistor ST2 is connected to the source of a memory cell transistor MTn.

Each of the memory cells is connected to a word line and a bit line. Each of the memory cells may be identified with the address identifying the word line and the address identifying the bit line. As described above, the data in the memory cells (the memory cell transistors MT) in a block BLK is collectively deleted. On the other hand, the data is read and written in the unit of a plurality of memory cells commonly connected to a word line WL, namely, in the unit of a memory group.

FIG. 4 is a diagram of an exemplary configuration of a block of a memory cell array with a three-dimensional structure. FIG. 4 illustrates a block BLK among a plurality of blocks forming the memory cell array with a three-dimensional structure. The other blocks of the memory cell array have the same structure as the structure illustrated in FIG. 4.

As illustrated in FIG. 4, the block BLK includes, for example, four fingers FNG (FNG0 to FNG3). Each of the fingers FNG includes a plurality of NAND strings NS. Each of the NAND strings NS includes, for example, eight memory cell transistors MT (MT0 to MT7), and select transistors ST1 and ST2. Note that the number of memory cell transistors MT is not limited to eight. The memory cell transistors MT are placed between the select transistors ST1 and ST2 such that their current pathways are connected in series. The current pathway of a memory cell transistor MT7 that is a first end of the series connection is connected to a first end of the current pathway of the select transistor ST1, while the current pathway of a memory cell transistor MT0 that is a second end of the series connection is connected to a first end of the current pathway of the select transistor ST2.

The gates in each of the select transistors ST1 of the fingers FNG0 to FNG3 are commonly connected to each of the select gate lines SGD0 to SGD3. On the other hand, the gates in the select transistors ST2 in the fingers FNG are commonly connected to a select gate line SGS. Furthermore, the control gates of the memory cell transistors MT0 to MT7 in a block BLK are commonly connected to each of the word lines WL0 to WL7. In other words, the word lines WL0 to WL7 and the select gate line SGS are shared among the fingers FNG0 to FNG3 in a block BLK, while each of the select gate lines SGD is independently provided to each of the fingers FNG0 to FNG3 even in a block BLK.

The control gate electrodes of the memory cell transistors MT0 to MT7 forming a NAND string NS are connected to the word lines WL0 to WL7, respectively. The memory cell transistors MTi (i=0 to n) in each of the NAND string NS are commonly connected to each other by a word line WLi (i=0 to n). In other words, the control gate electrodes of the memory cell transistors MTi in a row in a block BLK are connected to a word line WLi.

Each of the memory cells is connected to a word line and a bit line. Each of the memory cells may be identified with the address identifying the word line and the address identifying the bit line. As described above, the data in the memory cells (the memory cell transistors MT) in a block BLK is collectively deleted. On the other hand, the data is read and written in the unit of a plurality of memory cells groups MG commonly connected to a word line WL.

As described above, there are various types of memory cell arrays and various methods for producing them. When data is written to a NAND memory, electrons are inserted in accordance with the data value such that the number of electrons (the amount of charge) at the floating gate corresponds to one of a plurality of regions (threshold region). To simplify the description, an example of a one-bit/cell memory cell that stores a bit will be described herein. In the one-bit/cell memory cell, one of two distributions corresponds to "0" while the other corresponds to "1". When a voltage is applied to the memory cell and the applied voltage is equal to or higher than the voltage value in accordance with the amount of charge of the memory cell, a current flows. When a voltage lower than the voltage value is applied to the memory cell, a current does not flow. Thus, the boundary voltage is determined for each memory cell in accordance with the amount of charge of the memory cell. The voltage determined in accordance with the amount of charge of the memory cell is herein referred to as a threshold voltage (Vth).

Charges are inserted when data is written such that the voltage is in a desired threshold region. The threshold voltage varies depending on the memory cell. The number of memory cells at each threshold value, namely, the frequency at each threshold voltage is referred to as a threshold distribution. When the data is read from a memory cell, applying a standard reading voltage to the memory cell can determine whether the data stored in the memory cell is "1". The standard reading voltage divides the two threshold distributions. However, the characteristics of all the memory cells are actually not the same and this causes the variations in the threshold voltage.

Figure 5:
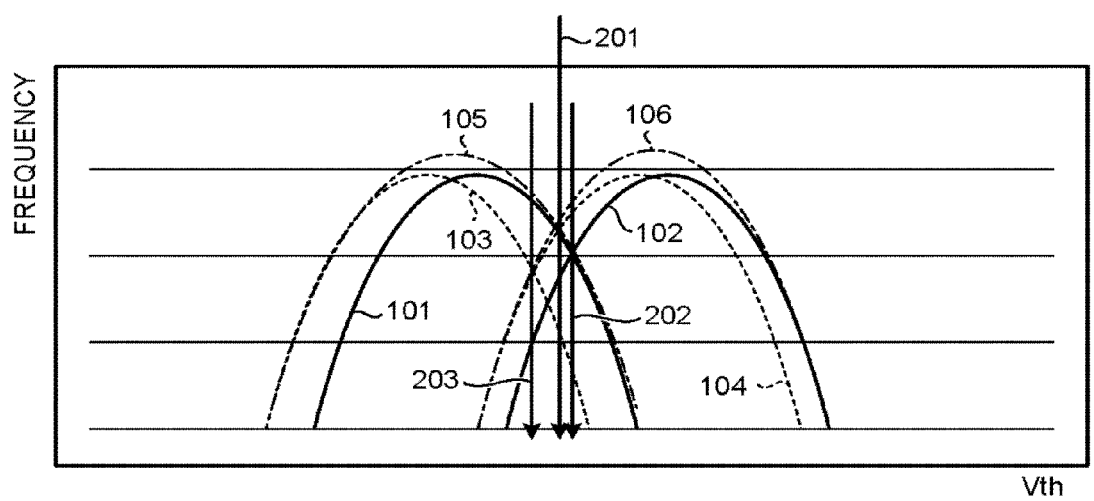
FIG. 5 is a diagram of exemplary threshold distributions.

FIG. 5 is a diagram of exemplary threshold distributions. A distribution 101 and a distribution 102 correspond to the data values 1 and 0 of the memory cells having a first memory characteristic, respectively. In other words, the distribution 101 is the frequency (the number of memory cells) at each threshold voltage of the memory cells to which "1" is written among the memory cells having the first memory characteristic. The distribution 102 is the frequency at each threshold voltage of the memory cells to which "0" is written among the memory cells having the first memory characteristic. Similarly, a distribution 103 and a distribution 104 correspond to the data values 1 and 0 of the memory cells having a second memory characteristic, respectively. A distribution 105 and a distribution 106 correspond to the data values 1 and 0 of the memory cells when the memory cells having the first and second memory characteristics are not distinguished, respectively.

For example, when the threshold distribution of the data value "0" and the threshold distribution of the data value "1" are not completely separated as the distribution 105 and the distribution 106 illustrated in FIG. 5, wrong values are read from some of the memory cells even when the reading voltage that is the boundary between the values "0" and "1" is applied and the reading is performed. In light of the foregoing, data is usually stored as a codeword in a memory cell after being encoded with an error correcting code. When the number of errors is equal to or smaller than the number of errors that can be corrected, the written data may be restored. However, a large number of errors prevent the errors from being corrected. Thus, an optimal reading voltage is preferably applied such that the values "0" and "1" can be distinguished as correctly as possible when data is read from the memory cell.

When data is read without distinguishing the memory cells having the first characteristic from those having the second characteristic, a reading voltage 201 is the optimal reading voltage to distinguish the data value "0" from the data value "1". However, a reading voltage 202 is the optimal reading voltage for the memory cells having the first characteristic, and a reading voltage 203 is the optimal reading voltage for the memory cells having the second characteristic. Thus, applying different reading voltages to the memory cells having the first characteristic and the memory cells having the second characteristic, respectively, can reduce the errors in the reading of the data from the memory cells having either of the characteristics.

The characteristic of each of the bit lines (the characteristic of the memory cells connected to a bit line) may be considered as one of the factors for determining the characteristic of a memory cell. The characteristics of the memory cells sometime vary according to each bit line, for example, depending on the production method. The variations in the memory cell characteristic have periodicity. For example, the even-numbered bit lines have a characteristic different from the characteristic of the odd-numbered bit lines and when the characteristics vary in a cycle of four bit lines, a characteristic A, a characteristic B, a characteristic C, and a characteristic D repeatedly appear in the bit line direction. In such a case, appropriately changing the reading voltage according to the bit lines having the same characteristic (the memory cells connected to the bit lines) can reduce the errors in the reading of the data from the memory cell having either of the characteristics.

The periodicity of the characteristics of the memory cells described above may be caused by variations in the manufacturing process, for example, where thicknesses of the bit lines or widths of the spaces among the bit lines vary periodically. Additionally, when a memory cell array has a staggered structure in which a sets of N contacts are repeatedly placed while forming a staggered arrangement on the assumption that N is an integer equal to or larger than two, N types of characteristics sometimes appear periodically.

However, a reading voltage is applied to each of the word lines in a NAND memory to read data. Thus, different reading voltages are not applied to the memory cells connected on a word line in the usual condition.

To reduce the errors in the reading of data, a codeword is generated with the data corresponding to the same I/O number (the data input via the pin corresponding to the same I/O number to the nonvolatile memory 3) in the unit of I/O data in the present embodiment. Eight codewords are generated in parallel because an I/O data unit is eight bits in the present embodiment. The codewords are stored in a page in the present embodiment. Thus, eight codewords are generated per page. To simplify the description, it is assumed herein that eight codewords are generated per page. However, the number that is a multiple of eight of codewords may be generated. A certain reading voltage is used first to read data from the nonvolatile memory 3. Then, the received words corresponding to the read data, namely, the written codewords are decoded. When there is a received word that fails to be decoded, the data corresponding to the I/O number of the codeword that fails to be decoded is read again after the reading voltage is changed. Then, the data read again, namely, the data corresponding to the data that fails to be decoded is decoded. As a result, a reading voltage appropriate to each I/O number may be applied to read data. Note that, because the unit of I/O data is eight bits, the present embodiment may be applied when the bit lines have characteristics different between the even-numbered and odd-numbered bit lines, or when the characteristics vary in a cycle of four bit lines as described above.

Figure 6:
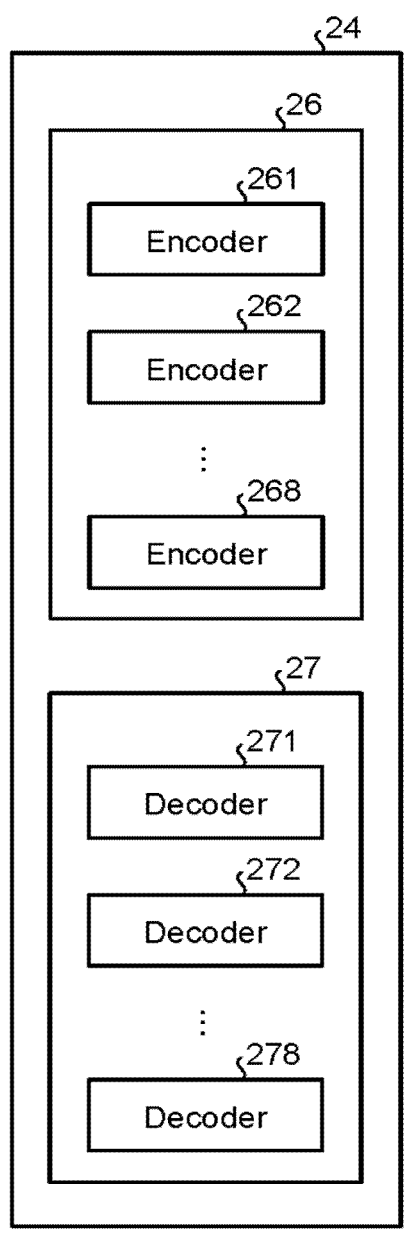
FIG. 6 is a diagram of an exemplary configuration of an encoding unit and a decoding unit.

FIG. 6 is a diagram of an exemplary configuration of an encoding unit 26 and a decoding unit 27 according to the present embodiment. As illustrated in FIG. 6, the encoding unit 26 includes Encoder 261 to Encoder 268, and the decoding unit 27 includes Decoder 271 to Decoder 278 according to the present embodiment. According to the present embodiment, an Encoder is provided to each of the I/O numbers as illustrated in FIG. 6 in order to generate eight codewords in parallel as described above. Similarly, a Decoder is provided to each of the I/O numbers to decode eight codewords in parallel.

Figure 7:
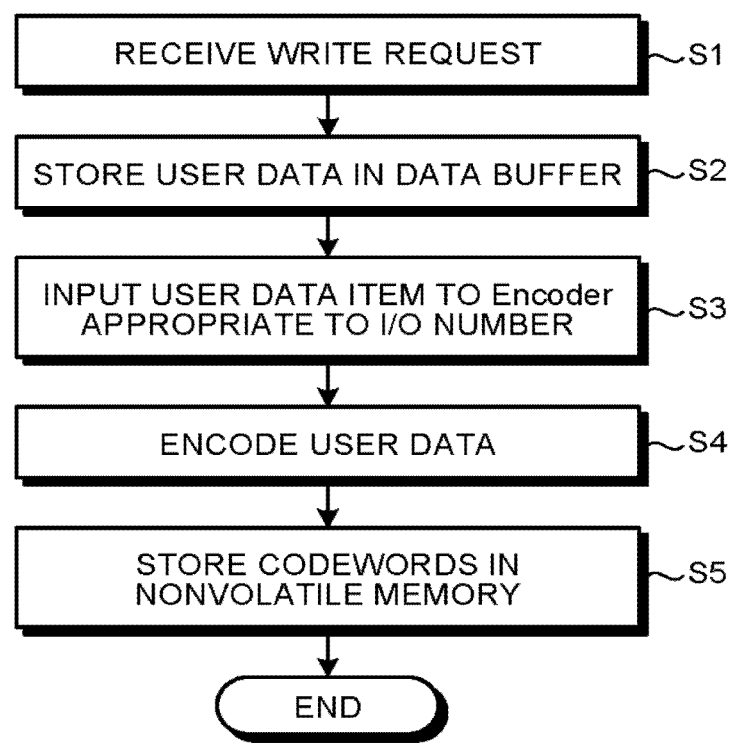
FIG. 7 is a flowchart of an exemplary writing process.

Next, the writing process and reading process according to the present embodiment will be described. FIG. 7 is a flowchart of an exemplary writing process according to the present embodiment. As illustrated in FIG. 7, when receiving a write request from the host 4 (step S1), the control unit 23 assigns a physical address to the logical address of the user data in the write request to determine the position to store the user data in the nonvolatile memory 3. The storing position is determined in the unit of page as described above. The memory controller 2 stores the user data input from the host 4 in the data buffer 25 (step S2). Specifically, the control unit 23 controls the components to divide the user data input from the host 4 into data by bit and arrange the data in the data buffer 25 in the order of the I/O numbers corresponding to the pins 5-1 to 5-8 through which the data of each of the bits is input to the nonvolatile memory 3. The control unit 23 may link the user data input from the host 4 to an arbitrary I/O number. For example, when data is input from the host 4 in the unit of byte, the control unit 23 may link the position of a bit in the data in the unit of byte fixedly to an predetermined I/O number. It is assumed herein that user data is input from the host 4 in the unit of byte and the ith bit in a byte is linked to an I/O number i.

According to the present embodiment, the data stored in a page is divided by the I/O number, in other words, is divided into eight as described above in order to encode the data. The codewords form the same structure in every page. Thus, the control unit 23 can determine the Encoder to which each data is to be input by maintaining the structures. According to the present embodiment, the memory controller 2 is configured to store a page of data in the data buffer 25 so as to input the user data to an Encoder appropriate to the user data after the user data forming eight codewords is stored.

Figure 8:
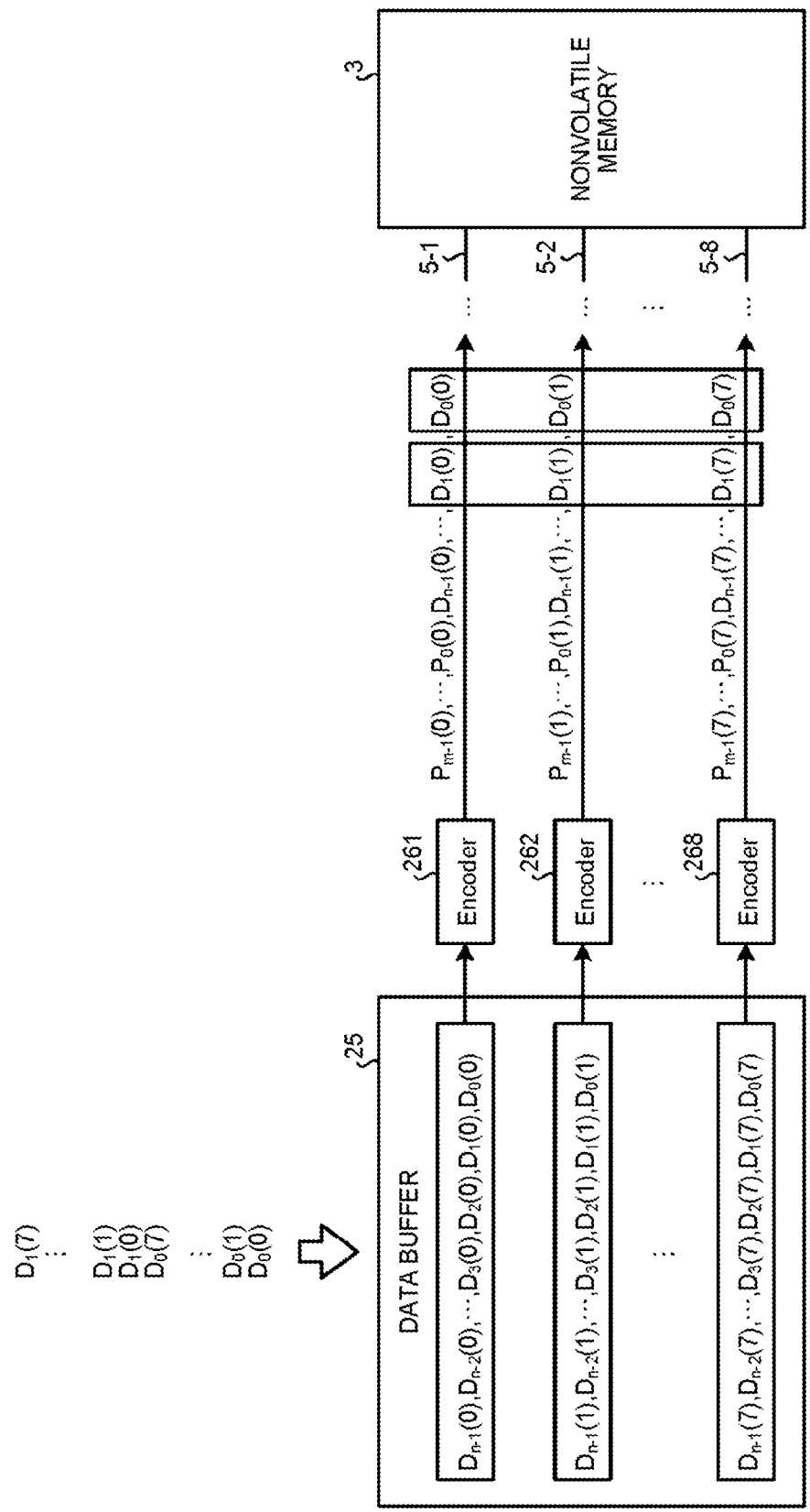
FIG. 8 is a diagram of exemplary data to be input to Encoders.

FIG. 8 is a diagram of exemplary data to be input to the Encoders 261 to 268 according to the present embodiment. The data to be input from the host 4 is illustrated on the top left of FIG. 8. In the present embodiment, the data in the bits in the ith byte input from the host 4 are referred to as $D_i(0)$, $D_i(1)$, $D_i(2)$, ..., and $D_i(7)$. Note that the number in the parenthesis indicates the position of the bit in the byte, namely, the I/O number of the data in the bit. Note that the $D_i(0)$, $D_i(1)$, $D_i(2)$, ..., and $D_i(7)$ are not actually be input as serial numbers although FIG. 8 illustrates the $D_i(0)$, $D_i(1)$, $D_i(2)$, ..., and $D_i(7)$ as serial numbers. The $D_i(0)$, $D_i(1)$, $D_i(2)$, ..., and $D_i(7)$ may be input in parallel. The control unit 23 collectively manages the user data having the same I/O number when the user data are input from the host 4 and stored in the data buffer 25. The data encompassed with each rectangle in the data buffer 25 illustrated in FIG. 8 are the data having the same I/O number, namely, the data having the same number in the parentheses. Note that the addresses are not necessarily arranged consecutively in the data buffer 25. This is because it is necessary only to confirm the position at which the data having the same I/O number are stored together.

With reference to FIG. 7 again, when a page of user data is stored in the data buffer 25, the control unit 23 inputs the data read from the data buffer 25 to the Encoders appropriate to the I/O numbers of the data (step S3). Specifically, as illustrated in FIG. 8, the data having the same I/O number are input to the Encoder appropriate to the I/O number. In the example of FIG. 8, the Encoders 261, 262, ..., and 268 correspond to the I/O numbers 0, 1, ..., and 7, respectively. It is assumed in the present embodiment that user data of n byte (n×eight bits) is stored in a page, and each of the Encoders 261, 262, ..., and 268 encodes the user data of n bits and generates a parity of m bits.

Next, the Encoders 261 to 268 generate codewords by encoding the input user data (step S4). As described above, the encoding generates a parity of m bits. Thus, as illustrated in FIG. 8, each of the codewords includes (n+m) bits. In FIG. 8, the jth bit in the parity of m bits corresponding to an I/O number k is indicated as $P_j(k)$.

Next, the memory controller 2 stores the generated codewords in the nonvolatile memory 3 (step S5). Then, the process for writing a page of data is terminated. Specifically, the codeword having an I/O number are input via the pin corresponding to the I/O number to the nonvolatile memory 3 and are stored in the memory cell array 33 in the nonvolatile memory 3.

Figure 9:
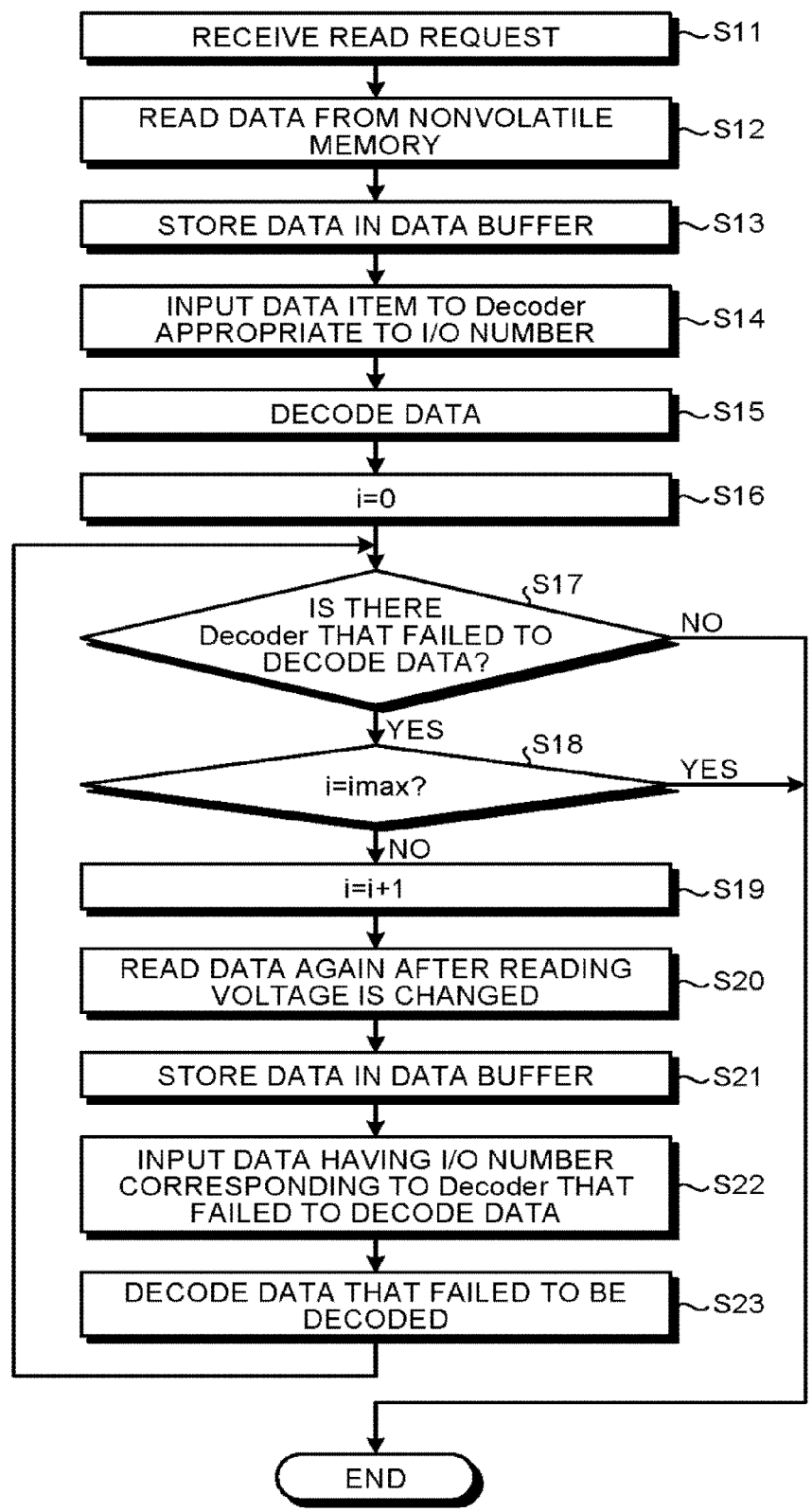
FIG. 9 is a flowchart of an exemplary reading process.

Next, the reading process will be described. FIG. 9 is a flowchart of an exemplary reading process according to the present embodiment. As described in FIG. 9, when receiving a read request from the host 4 (step S11), the memory controller 2 reads the data from the nonvolatile memory 3 (step S12), and stores the data in the data buffer 25 (step S13). Specifically, the control unit 23 finds the physical address of the user data in the read request from the logical address of the user data. Subsequently, the control unit 23 designates the physical address and gives the memory I/F 22 an instruction for reading the data from the page corresponding to the physical address in the nonvolatile memory 3. Then, the memory I/F 22 reads the data from the nonvolatile memory 3 in accordance with the instruction. The read data is stored in the data buffer 25. Meanwhile, the control unit 23 manages the data stored in the data buffer 25 by the I/O number, similarly to the writing of data.

Figure 10:
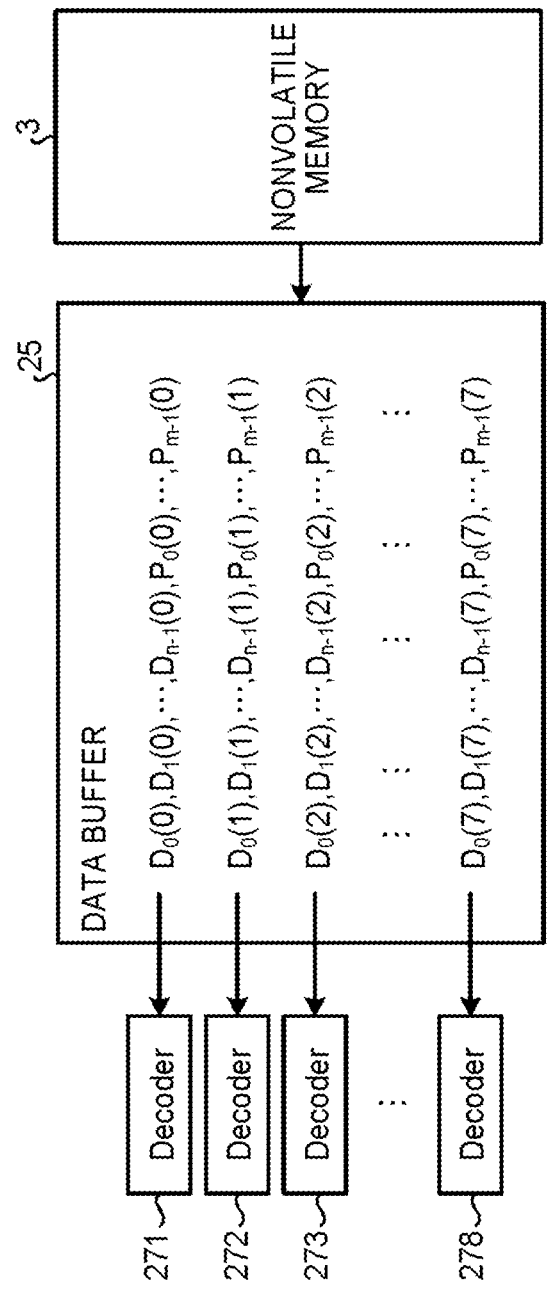
FIG. 10 is a diagram of exemplary data to be input to Decoders.

The control unit 23 inputs the data having an I/O number to a Decoder appropriate to the I/O number (step S14). FIG. 10 is a diagram of exemplary data to be input to Decoders 271 to 278 according to the present embodiment. As illustrated in FIG. 10, each of the data stored in the data buffer 25 is input to the Decoders 271 to 278 appropriate to the data.

With reference to FIG. 9 again, the Decoders 271 to 278 decode the input data (step S15). Note that the decoding includes the process for correcting an error in the data. When correcting an error, the Decoders 271 to 278 update the data in the data buffer 25 with the data in which the error is corrected. Furthermore, the Decoders 271 to 278 notifies to the control unit 23 whether the data is successfully decoded, in other words, the errors in the data are successfully corrected. Next, the control unit 23 initializes a counter i that indicates the number of iteration of decoding (step S16). The control unit 23 determines whether there is a Decoder that failed to decode the data in accordance with the notification from each of the Decoders 271 to 278 (step S17).

When there is a Decoder that failed to decode the data (Yes in step S17), the control unit 23 determines whether the counter i indicates the value equal to a value imax that indicates the upper limit of the number of iteration (step S18). When the number that the counter i indicates is not equal to the number imax (No in step S18), the control unit 23 determines that i=i+1 holds (step S19). Then, the memory controller 2 reads the data again with a reading voltage different from the reading voltage used in the reading in step S12 (step S20) to store the read data in the data buffer 25 (step S21). Specifically, the control unit 23 gives the memory I/F 22 an instruction for reading the data having the same physical address as the data read in step S12 with a reading voltage different from the reading voltage used in the reading in step S12. Subsequently, the memory I/F 22 reads the data from the nonvolatile memory 3 in accordance with the instruction. The read data is stored in the data buffer 25. At that time, it is not necessary to store the data that has been decoded successfully in the data buffer 25.

The control unit 23 inputs the data having the I/O number corresponding to the Decoder that failed to decode the data in the data read from the nonvolatile memory 3 in the data buffer 25 (step S22). The Decoder to which the data is input, namely, the Decoder that failed to decode the data decodes the input data (step S23). Then, the process goes back to step S17.

When it is determined in step S17 that there is no Decoder that failed to decode the data (No in step S17). It is determined that the data is successfully decoded and the process is terminated. Alternatively, when the number that the counter i indicates is equal to the number imax in step S18 (Yes in step S18), the control unit 23 determines that the data failed to be decoded and the decoding is failed, and the process is terminated.

The memory controller 2 performs the process every time a page is read. When the process is terminated, the data that is successfully decoded is transmitted to the host 4. When there is data that fails to be decoded, a predetermined process that is to be performed when the data fails to be decoded is performed. The predetermined process is, for example, a process for notifying to the host 4 that the data fails to be decoded, or a process for starting the next decoding process when the data is encoded with a multiple-stage error correcting method.

According to the present embodiment, when there is a Decoder that fails to decode data, only the data having the I/O number corresponding to the Decoder is decoded again, using the data that is read again with a changed reading voltage as described above. This can read data with a reading voltage appropriate to the characteristic of the bit line of the data when the bit lines have different characteristics varying from each other periodically, and thus can reduce the errors in the reading.

Note that any method may be used for the method for changing the reading voltage. For example, an optimal reading voltage is determined for each of the bit lines by tests before the shipment of the memory cell array. When the characteristics are divided into four; A, B, C, and D, and the four characteristics appear periodically according to the bit lines, and furthermore each of the memory cells is a single level cell, the reading voltages corresponding to the characteristics A, B, C, and D are set as voltages $V_A$, $V_B$, $V_C$, and $V_D$. Reading voltages that can reduce errors in all of the memory cells that have the characteristic A, B, C, or D are used in the initial reading (reading in step S12). When there is a Decoder that fails to decode data, the data is read again with, for example, the voltage $V_A$ among the voltages $V_A$, $V_B$, $V_C$, and $V_D$. When there is still a Decoder that fails to decode data, the data is read with the voltage $V_B$. When a Decoder that fails to decode data still remains after the data is read with all of the voltages $V_A$, $V_B$, $V_C$, and $V_D$, the data may be read again with a reading voltage different from the voltages $V_A$, $V_B$, $V_C$, and $V_D$.

The eight Encoders 261 to 268 are used in the present embodiment to generate eight codewords by the I/O number. For example, an Encoder, or less than eight Encoders may be used to generate codewords by the I/O number with a time-sharing encoding method. Similarly, a Decoder, or less than eight Decoders may be used to decode the data of each of the I/O numbers with a time-sharing decoding method.

When the memory cells are multi level cells, a plurality of reading voltages are set at a single reading. Thus, a plurality of reading voltages is determined for each of the characteristics. For example, when the bit lines have four characteristics as described above and each of the memory cells is a two-bit/cell memory cell, reading voltages are found for each of the boundaries among the threshold distributions, in other words, three reading voltages are found. Then, the reading voltages are used to read the data again, similarly to the reading process described above.

Second Embodiment

Next, a second embodiment will be described. A storage device 1 according to the present embodiment has the same structure as the structure of the storage device 1 according to the first embodiment. Hereinafter, the different points from the first embodiment will be described.

Figure 11:
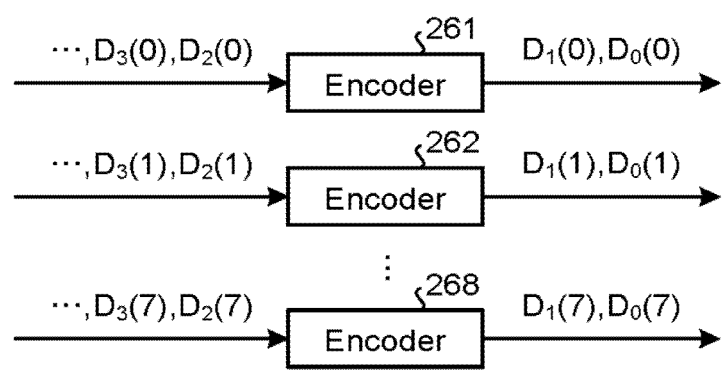
FIG. 11 is a diagram of the input of data to Encoders according to a second embodiment.

According to the first embodiment, data are encoded after all of the data to be input to the Encoders 261 to 268 are stored in the data buffer 25. However, data may be input to the Encoders 261 to 268 before all of the data are stored in the data buffer 25. FIG. 11 is a diagram of the input of the data to Encoders 261 to 268 according to the present embodiment. When, for example, a data $D_0(0)$ is input to the Encoder 261 in the present embodiment, the Encoder 261 encodes $D_0(0)$ with an encoding operation, and outputs $D_0(0)$ without initializing the state inside the Encoder 261. Next, when a data $D_1(0)$ is input to the Encoder 261, the Encoder 261 encodes $D_1(0)$ with an encoding operation continuing from the state of the encoding operation of $D_0(0)$, and outputs $D_1(0)$ without initializing the state inside the Encoder 261. As described above, an Encoder performs an operation every time a piece of data is input to the Encoder. This can reduce the capacity of the data buffer 25.

Similarly, the Decoders 271 to 278 may start decoding before all of the data read the nonvolatile memory stored in the data buffer 25. Each of the data may be sequentially input, decoded and output, and the output data may be stored in the data buffer 25. The other operations in the present embodiment are the same as the operations in the first embodiment.

Third Embodiment

Figure 12:
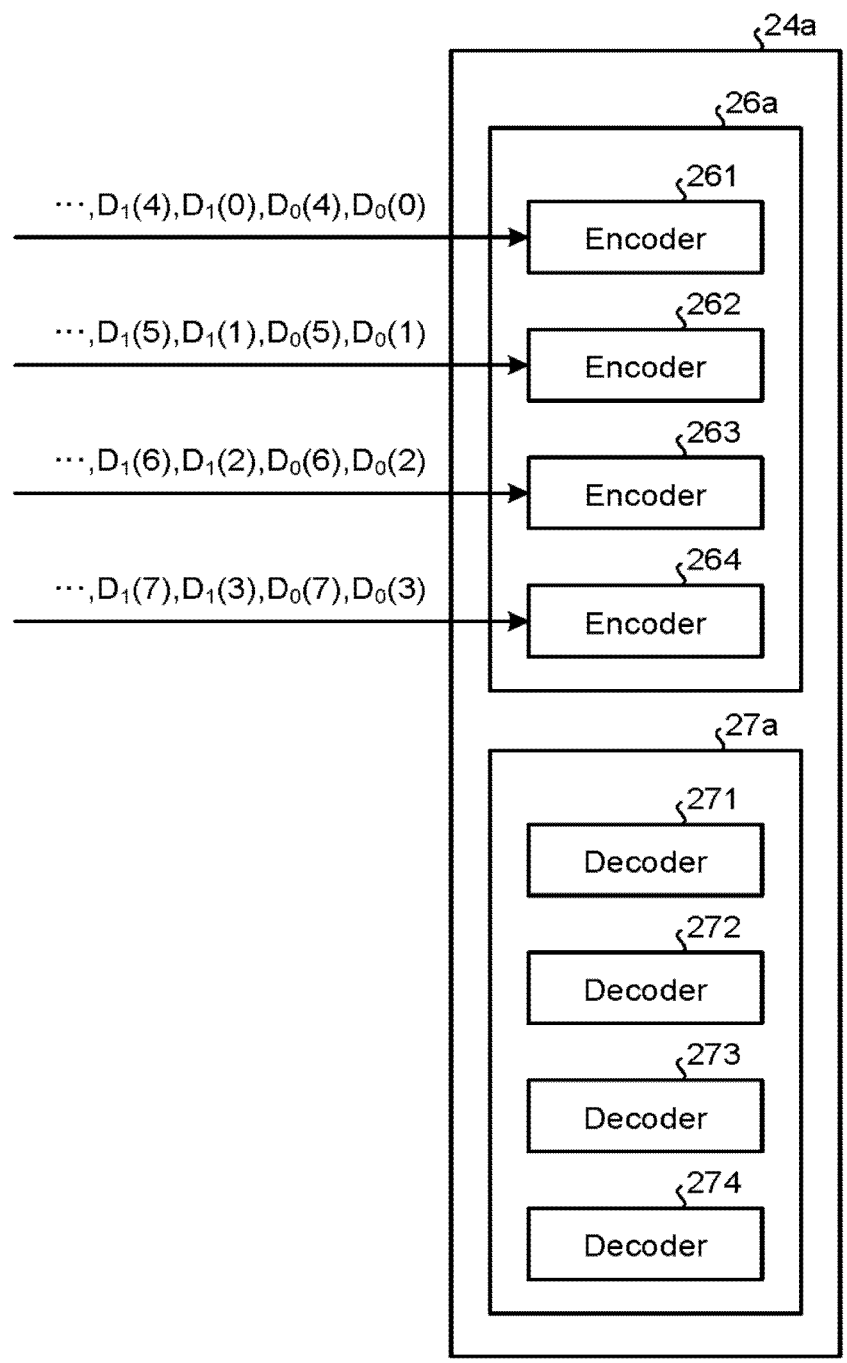
FIG. 12 is a diagram of an exemplary configuration of an ECC unit according to a third embodiment.

Next, a third embodiment will be described. FIG. 12 is a diagram of an exemplary configuration of an ECC unit 24*a* according to the present embodiment. The configuration of the storage device according to the present embodiment is the same as that of the storage device 1 according to the first embodiment except that the storage device according to the present embodiment includes the ECC unit 24*a* instead of the ECC unit 24 in the first embodiment. The ECC unit 24*a* includes an Encoding Unit 26*a* and a Decoding Unit 27*a*. The Encoding Unit 26*a* includes Encoders 261 to 264. The Decoding Unit 27*a* includes Decoders 271 to 274. Hereinafter, the points different from the first embodiment or the second embodiment will be described.

According to the first embodiment, a codeword is generated for each of the I/O numbers. However, codewords fewer than the number of bits of the unit of I/O data may be generated. For example, the number of codewords to be generated is one M-th (the M is an integer equal to or larger than one) of the number of bits of the unit of I/O data. The Encoders 261 to 264 are used to generate four codewords in the present embodiment when the unit of I/O data is eight bits, similarly to the first embodiment. Specifically, as illustrated in FIG. 12, data $D_0(0)$, $D_0(1)$, $D_0(2)$, and $D_0(3)$ are input to the Encoders 261, 262, 263, and 264, respectively, and data $D_0(4)$, $D_0(5)$, $D_0(6)$, and $D_0(7)$ are subsequently input to the Encoders 261, 262, 263, and 264, respectively. The data corresponding to the I/O number 0, and the I/O number 4 are input to the Encoder 261. The data corresponding to the I/O number 1, and the I/O number 5 are input to the Encoder 262. The data corresponding to the I/O number 2, and the I/O number 6 are input to the Encoder 263. The data corresponding to the I/O number 3, and the I/O number 7 are input to the Encoder 264. As described above, a codeword is generated with the data corresponding to two I/O numbers at an interval of three. This enables a codeword to be generated according to each of the characteristics when the characteristics vary in a cycle of four bit lines. Note that data may be input to the Encoders 261 to 264 after all of the data are stored in the data buffer 25 once as described in the first embodiment, or data may sequentially be input to the Encoders 261 to 264 as described in the second embodiment.

To decode the data, the data corresponding to the I/O number 0 and the I/O number 4 are input to the Decoder 271, the data corresponding to the I/O number 1 and the I/O number 5 are input to the Decoder 272, the data corresponding to the I/O number 2 and the I/O number 6 are input to the Decoder 273, and the data corresponding to the I/O number 3 and the I/O number 7 are input to the Decoder 274. Note that data may be input to the Decoders 271 to 274 after all of the data are stored in the data buffer 25 once as described in the first embodiment, or data may sequentially be input to the Decoders 271 to 274 as described in the second embodiment. The other operations in the present embodiment are the same as the operations in the first embodiment.

According to the present embodiment, four codewords are generated while the I/O numbers are divided into four sets of two numbers. However, codewords may be generated with two Encoders from the data having the even-numbered I/O numbers and from the data having the odd-numbered I/O numbers, respectively.

Figure 13:
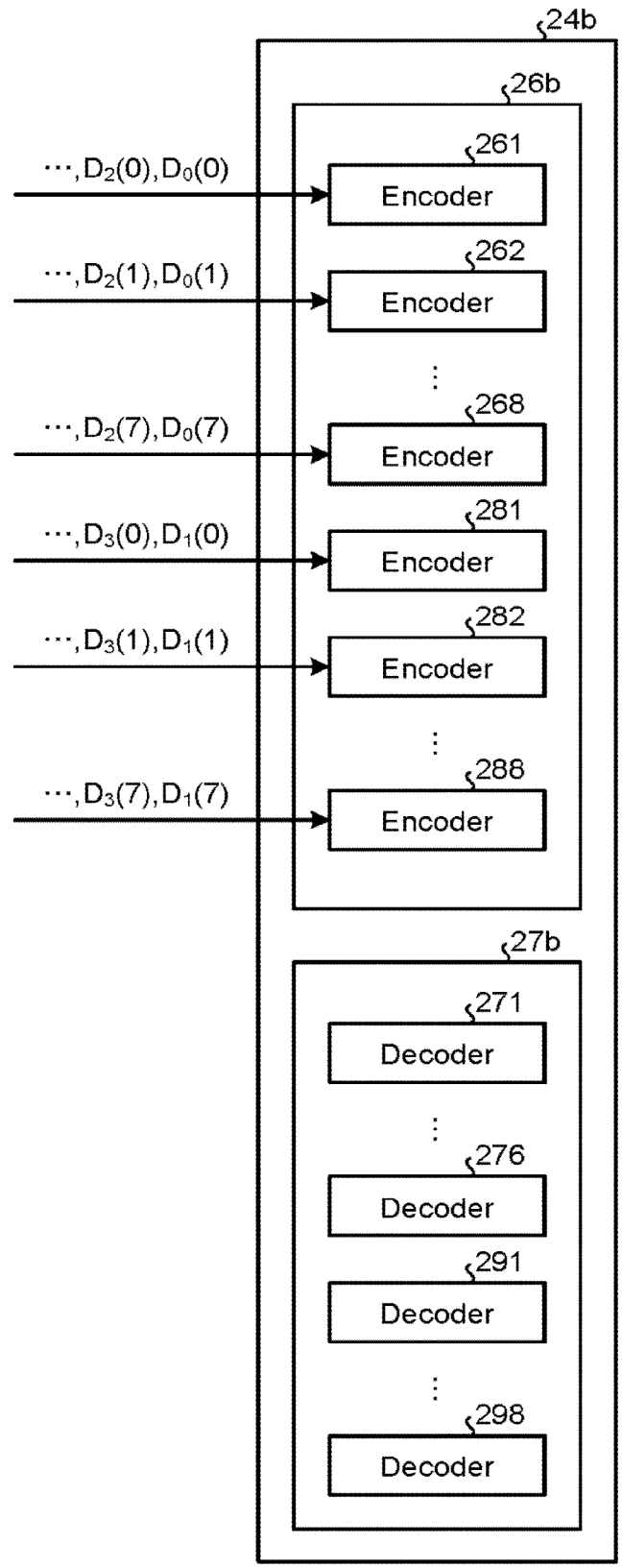
FIG. 13 is a diagram of an exemplary configuration of an encoder and a decoder when codewords are generated more than the number of bits that is a unit of I/O data.

As illustrated in FIG. 13, the number of codewords more than the number of bits of the unit of I/O data may be generated. For example, the number of codewords to be generated is M times (the M is an integer equal to or larger than one) the number of bits of the unit of I/O data. FIG. 13 is a diagram of an exemplary configuration of an ECC unit 24b to generate the number of codewords more than the number of bits of the unit of I/O data. By generating the number of codewords more than the number of bits of the unit of I/O data, the data may be read with a reading voltage appropriate to the characteristic of the bit line even when the characteristics vary in a longer cycle than the unit of I/O data. The configuration of the storage device in the example in FIG. 13 is the same as that of the storage device 1 according to the first embodiment except that the storage device in the example in FIG. 13 includes the ECC unit 24b instead of the ECC unit 24 in the first embodiment.

The ECC unit 24b includes an Encoding Unit 26b and a Decoding Unit 27b. The Encoding Unit 26b includes 16 Encoders, Encoders 261 to 268, and 281 to 288 in total. The Decoding Unit 27b includes 16 Decoders, Decoders 271 to 278, and 291 to 298 in total.

As illustrated in FIG. 13, for example, data $D_0(0)$ to $D_0(7)$ are input to Encoders 261 to 268, respectively and data $D_1(0)$ to $D_1(7)$ are input to Encoders 281 to 288, respectively. Subsequently, data $D_2(0)$ to $D_2(7)$ are input to Encoders 261 to 268, respectively, and data $D_3(0)$ to $D_3(7)$ are input to Encoders 281 to 288, respectively. As described above, the data having an I/O number are divided and input to the two Encoders. This generates 16 codewords.

To decode the data, 16 Decoders are used similarly. The other operations in the present embodiment are the same as the operations in the first embodiment.

According to the present embodiment, the number of codewords fewer or more than the number of bits of the unit of I/O data is generated as described above. This can reduce the number of codewords to be generated in parallel in comparison with the first embodiment when different characteristics appear in a cycle shorter than the unit of I/O data, and thus can reduce the number of Encoders and Decoders. This also can read data with a reading voltage appropriate to the characteristic of the bit line when different characteristics appear in a cycle longer than the unit of I/O data.

An example in which the variations in the memory characteristic have periodicity in the bit line direction is described in the embodiments. However, not only when the variations have periodicity, but also when the bit lines randomly have different characteristics, a codeword may be generated according to each of the characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory to which first to m-th (the m is an integer equal to or larger than two) data are capable of being input in parallel, and from which the first to m-th data are capable of being output in parallel;
a memory interface configured to control reading/writing data from/to the nonvolatile memory;
an encoding unit configured to encode each of first to n-th (the n is an integer equal to or larger than two) input data to generate first to n-th codewords; and
a control unit configured to link the first to n-th codewords to the first to m-th data to be input to the nonvolatile memory and cause the memory interface to write the first to m-th data to the nonvolatile memory.

2. The memory system according to claim 1, wherein the nonvolatile memory includes a plurality of bit lines, a plurality of word lines, and a plurality of memory cells connected to the bit lines and the word lines, and the first to m-th data are stored in the memory cells separately connected to the bit lines, respectively.

3. The memory system according to claim 1, further comprising:
a decoding unit configured to decode each of first to n-th received words that correspond to the first to n-th codewords to output the decoded first to n-th received words as output data,
wherein the control unit causes the memory interface to read the first to m-th data from the nonvolatile memory to link the read first to m-th data to the first to n-th received words.

4. The memory system according to claim 3, wherein the control unit causes the memory interface to change a reading voltage and read the first to m-th data from the nonvolatile memory when the control unit determines that the decoding unit failed to decode an a-th (the a is an integer and 1≤a≤n holds) received word among the first to n-th received words.

5. The memory system according to claim 4, wherein the control unit inputs a piece of data corresponding to the a-th received word among the first to m-th data read with the changed reading voltage to the decoding unit, and
the decoding unit decodes the input data corresponding to the a-th received word.

6. The memory system according to claim 5, wherein the encoding unit includes first to n-th encoders, and a b-th (the b is an integer and 1≤b≤n holds) encoder generates the b-th codeword in accordance with the b-th input data.

7. The memory system according to claim 6, wherein the decoding unit includes first to n-th decoders, the control unit inputs a c-th (the c is an integer and 1≤c≤n holds) received word to the c-th decoder, and the c-th decoder decodes the c-th received word.

8. The memory system according to claim 7,
wherein a value of the m is identical to a value of the n, and the control unit links a d-th (the d is an integer and 1≤d≤n holds) codeword to the d-th data, and links the d-th data to the d-th received word.

9. The memory system according to claim 8, wherein the control unit causes the memory interface to read the first to m-th data from the nonvolatile memory with a reading voltage corresponding to the d-th data when the control unit determines that the decoding unit fails to decode the dth received word.

10. The memory system according to claim 3, wherein the value of the m is a value that is e (the e is an integer equal to or larger than two) times the value of the n, and the control unit links a f-th (the f is an integer and $1 \leq f \leq n$ holds) codeword to (g−e+1)-th to g-th (the g is an integer that is e times f) data, and links the (g−e+1)-th to g-th data to the f-th received word.

11. A method for controlling a nonvolatile memory to which first to m-th (the m is an integer equal to or larger than two) data are capable of being input in parallel, and from which the first to m-th data are capable of being output in parallel, the method comprising:
 encoding each of first to n-th (the n is an integer equal to or larger than two) input data to generate first to n-th codewords;
 linking the first to n-th codewords to the first to m-th data to be input to the nonvolatile memory; and
 writing the first to m-th data to the nonvolatile memory.

12. The method according to claim 11, wherein the nonvolatile memory includes a plurality of bit lines, a plurality of word lines, and a plurality of memory cells connected to the bit lines and the word lines, and the first to m-th data are stored in the memory cells separately connected to the bit lines, respectively.

13. The method according to claim 11, further comprising:
 decoding each of first to n-th received words that correspond to the first to n-th codewords to output the decoded first to n-th received words as output data,
 reading the first to m-th data from the nonvolatile memory and linking the read first to m-th data to the first to n-th received words.

14. The method according to claim 13, further comprising:
 changing a reading voltage and reading the first to m-th data from the nonvolatile memory when the decoding of an a-th (the a is an integer and $1 \leq a \leq n$ holds) received word among the first to n-th received words is failed.

15. The method according to claim 14, further comprising:
 decoding a piece of data corresponding to the a-th received word among the first to m-th data read with the changed reading voltage.

16. The method according to claim 15, wherein the encoding is performed with first to n-th encoders, and
 a b-th (the b is an integer and $1 \leq b \leq n$ holds) encoder generates the b-th codeword in accordance with the bth input data.

17. The method according to claim 16, wherein the decoding is performed with first to n-th decoders, and
 a c-th decoder decodes the c-th (the c is an integer and $1 \leq c \leq n$ holds) received word.

18. The method according to claim 17, further comprising:
 linking a d-th (the d is an integer and $1 \leq d \leq n$ holds) codeword to the d-th data, and linking the d-th data to the d-th received word,
 wherein a value of the m is identical to a value of the n.

19. The method according to claim 18, further comprising:
 reading the first to m-th data from the nonvolatile memory with a reading voltage corresponding to the d-th data when the decoding of the d-th received word is failed.

20. The method according to claim 13, further comprising:
 linking the f-th (the f is an integer and $1 \leq f \leq n$ holds) codeword to the (g−e+1)-th to gth (the g is an integer that is e times f) data, and linking the (g−e+1)-th to g-th data to the f-th received word,
wherein the value of the m is a value that is e (the e is an integer equal to or larger than two) times the value of the n.

* * * * *